United States Patent [19]
Sung et al.

[11] Patent Number: 5,633,830
[45] Date of Patent: May 27, 1997

[54] RANDOM ACCESS MEMORY BLOCK CIRCUITRY FOR PROGRAMMABLE LOGIC ARRAY INTEGRATED CIRCUIT DEVICES

[75] Inventors: Chiakang Sung, Milpitas; Wanli Chang, Saratoga; Joseph Huang, San Jose; Richard G. Cliff, Milpitas, all of Calif.

[73] Assignee: Altera Corporation, San Jose, Calif.

[21] Appl. No.: 555,106

[22] Filed: Nov. 8, 1995

[51] Int. Cl.$^6$ .................................................. G11C 7/00
[52] U.S. Cl. ................ 365/221; 365/230.02; 365/230.09
[58] Field of Search .................... 365/230.01, 230.02, 365/230.09, 221, 219

[56] References Cited

U.S. PATENT DOCUMENTS

| | | | |
|---|---|---|---|
| 5,128,559 | 7/1992 | Steele | 307/465 |
| 5,469,400 | 11/1995 | Yamano | 365/230.01 |

FOREIGN PATENT DOCUMENTS

| | | | |
|---|---|---|---|
| 2281427 | 1/1995 | United Kingdom | H03K 19/173 |

OTHER PUBLICATIONS

John L. Nichols, "A Logical Next Step for Read–Only Memories", Electronics, Jun. 12, 1967, pp. 111–113.

Floyd Kvamme, "Standard Read–Only Memories Simplify Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–111.

William I. Fletcher et al., "Simplify Sequential Circuit Designs", Electronic Design, Jul. 8, 1971, pp. 70–72.

Howard A. Sholl et al., "Design of Asynchronous Sequential Networks Using Read–Only Memories", IEEE Transactions on Computers, vol. C–24, No. 2, Feb. 1975, pp. 195–206.

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

*Primary Examiner*—Son T. Dinh
*Attorney, Agent, or Firm*—Fish & Neave; Robert R. Jackson

[57] ABSTRACT

A relatively large block of random access memory ("RAM") may be provided on a programmable logic array integrated circuit device for use as read-only memory ("ROM") or RAM during operation of the device to perform logic. The RAM block is connected in the circuitry of the device so that it can be programmed and verified compatibly with other memory on the device. Thereafter the circuitry of the RAM block allows it to be switched over to operation as RAM or ROM during logic operation of the device.

37 Claims, 2 Drawing Sheets

RANDOM ACCESS MEMORY BLOCK CIRCUITRY FOR PROGRAMMABLE LOGIC ARRAY INTEGRATED CIRCUIT DEVICES

BACKGROUND OF THE INVENTION

This invention relates to programmable logic array integrated circuit devices, and more particularly to the provision of relatively large blocks of random access memory ("RAM") on such devices.

Commonly assigned, co-pending, Cliff et al. U.S. patent applications Ser. No. 08/245,509, filed May 18, 1994, and Ser. No. 08/442,795, filed May 17, 1995, show programmable logic array integrated circuit devices with relatively large blocks of random access memory ("RAM") in addition to the usual large number of programmable logic modules and the usual programmable network of interconnection conductors. (These two patent applications are hereby incorporated by reference herein.) These RAM blocks can be programmed at the same time that the rest of the device is programmed and thereafter used as read-only memory ("ROM") to perform logic, arithmetic functions, state machine operations, etc., that may be more efficiently performed in one large memory block (or a small number of such blocks) rather than in several of the individually relatively small logic modules. Alternatively, the RAM blocks may be used as random access memory during use of the device to perform logic.

From the foregoing it will be seen that the above-mentioned RAM blocks have several possible uses and require several different modes of operation. They should be programmable like other memory cells on the device (i.e., the other memory cells that control the functioning of the logic modules and the interconnection conductor network). This is necessary when the RAM blocks are to be used as ROM. Their programming in this way should be capable of verification like other memory cells on the device (i.e., reading out of the programmed data to ensure that the memory cells are programming properly). The RAM blocks should also be programmable as random access memory during use of the device to perform logic. And the RAM blocks should be readable as random access memory or read-only memory, also during use of the device to perform logic. All of these possible uses and modes of operation of these RAM blocks tend to significantly complicate the circuitry required to provide such blocks.

In view of the foregoing, it is an object of this invention to improve and simplify the provision of blocks of RAM on programmable logic array integrated circuit devices.

It is a more particular object of this invention to provide RAM block circuitry for use on programmable logic array integrated circuit devices that facilitates programming and verification of the RAM block for use as ROM, and that also facilitates programming and reading the block as RAM during use of the device to perform logic.

SUMMARY OF THE INVENTION

These and other objects of the invention are accomplished in accordance with the principles of the invention by providing programmable logic array integrated circuit devices with RAM blocks, the columns of which can be connected in the usual first-in-first-out ("FIFO") chains of other memory cells on the device for programming and verification with the other memory cells. Such programming and verification of the RAM block is row by row, similar to the programming and verification of the other memory cells. During use of the device to perform logic, the RAM block is disconnected from the FIFO chains, and the RAM becomes instead addressable by the other logic on the device for reading and writing. This addressing is preferably based on both row and column selection, and is therefore different from the row-by-row addressing which takes place during programming and verification. For example, this addressing may be based on selection of one row and one column of the RAM block for completely serial operation of the RAM block. Or this addressing may be based on one row and several columns, so that operation of the RAM is partly parallel.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
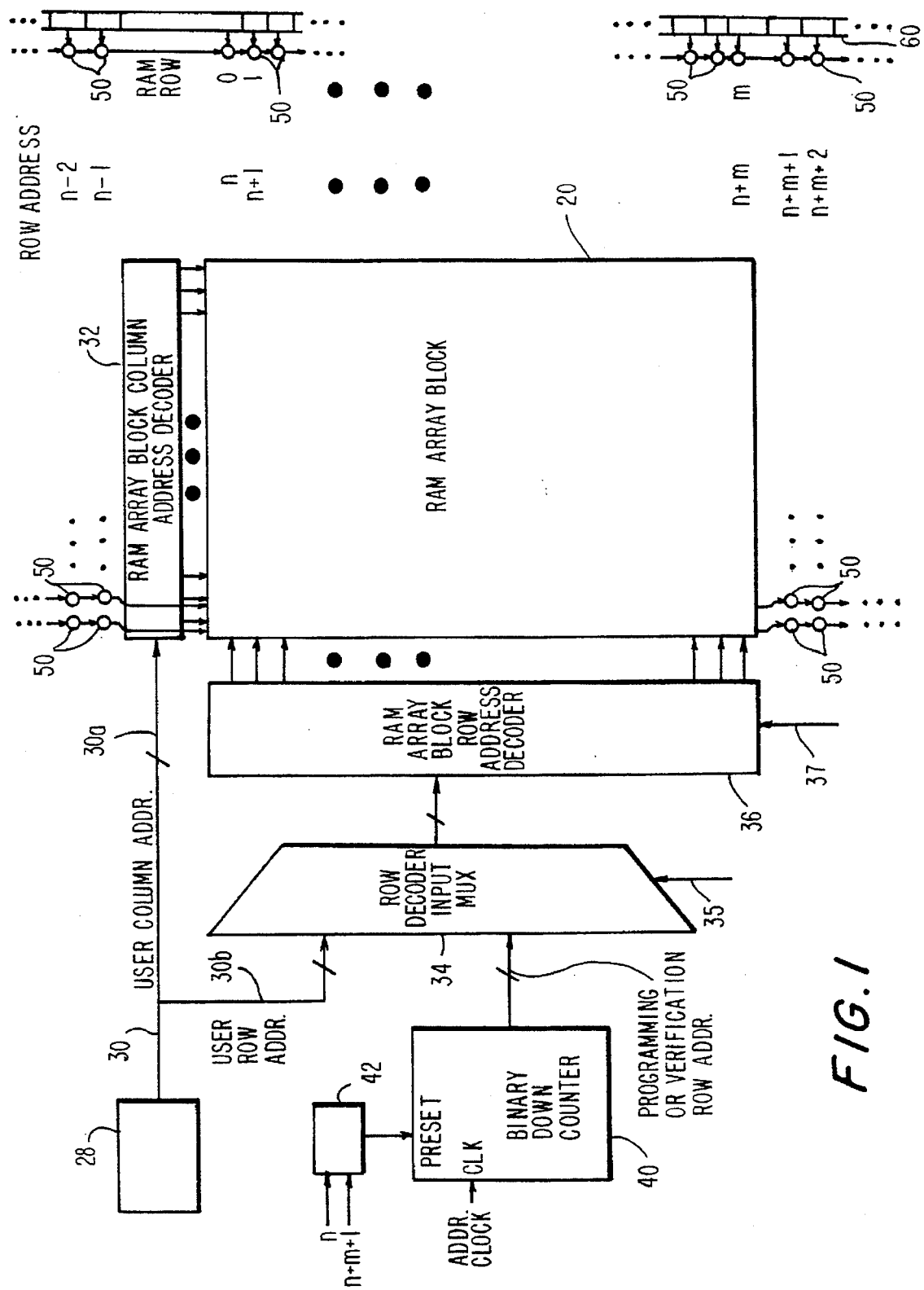
FIG. 1 is a simplified block diagram of a representative portion of illustrative programmable logic array integrated circuit device circuitry that can be implemented using this invention.

A representative portion of a programmable logic array integrated circuit device, which includes a relatively large RAM block 20 and which can be constructed in accordance with the principles of this invention, is shown in FIG. 1. This FIG. is the same as FIG. 1 in commonly assigned, concurrently filed, U.S. patent application Ser. No. 08/555,283 (Docket No. 174/093), which is hereby incorporated by reference herein. Because FIG. 1 is fully described in that other application, the description of it here will be somewhat abbreviated.

RAM block 20 has several rows and several columns of programmable memory cells. Typical ones of these memory cells are shown in more detail at 110 in FIG. 2 (which depicts a portion of one representative column in RAM block 20). Illustratively, RAM block 20 may have 64 rows (numbered 0 through m=63) and 32 columns of memory cells 110.

During use of the device to perform logic, coded information for addressing RAM block 20 may be supplied from other programmable logic 28 on the device via bus 30. For example, 11 bits of binary coded address information are required to select any one of 32×64=2048 memory cells 110 in RAM block 20. A portion of the address information on bus 30 is split off via sub-bus 30a and applied to column address decoder 32. Decoder 32 selects the column in RAM block 20 that is identified by the address information applied to it. (As described in above-mentioned Cliff et al. application Ser. No. 08/442,795, decoder 32 may alternatively select more than one column in RAM block 20 in order to provide partly parallel operation of that block. This possible feature will be discussed in more detail below, but initially it will be assumed that decoder 32 selects only one column in RAM block 20.) Selection of a column in RAM block 20 raises the potential on the column selection conductor 120 (FIG. 2) in that column sufficiently to turn on the transistors 122 and 124 connected to that conductor. In all columns that are not thus selected, the potential on the column selection conductors 120 is below that required to turn on the associated transistors 122 and 124.

The portion of the address information on bus 30 that is not applied to column decoder 32 is applied to row address decoder 36 via sub-bus 30b and switching circuits or mutiplexers 34. During use of the device to perform logic, multiplexers 34 are controlled by the mode control signal applied to them via lead 35 to connect sub-bus 30b rather than counter 40 to decoder 36. Row address decoder 36 responds to the address information applied to it by selecting the row in RAM block 20 that is identified by the applied address information. Selection of a row in RAM block 20 causes decoder 36 to raise the potential on either the read word conductor 190r (FIG. 2) or the write word conductor 190w (FIG. 2) of the selected row, depending on whether the read/write control signal on lead 37 indicates that data is to be read out of RAM block 20 or written into the RAM block.

For purposes of programming and verification (which take place prior to use of the device to perform logic), each column of RAM block 20 is connected in a respective one of a plurality columns of other programmable memory cells 50 on the device. Fragments of two such columns are shown in FIG. 1 above and below the RAM block circuitry. Cells 50 are the cells that control the functions performed by the device's logic modules, the connections made by the device's network of interconnection conductors, etc. As shown by the representative column toward the right in FIG. 1, many columns of memory cells 50 do not pass through RAM block 20. Those columns have as many rows of cells 50 where the RAM block would otherwise occur as the RAM block itself has rows.

Figure 2:
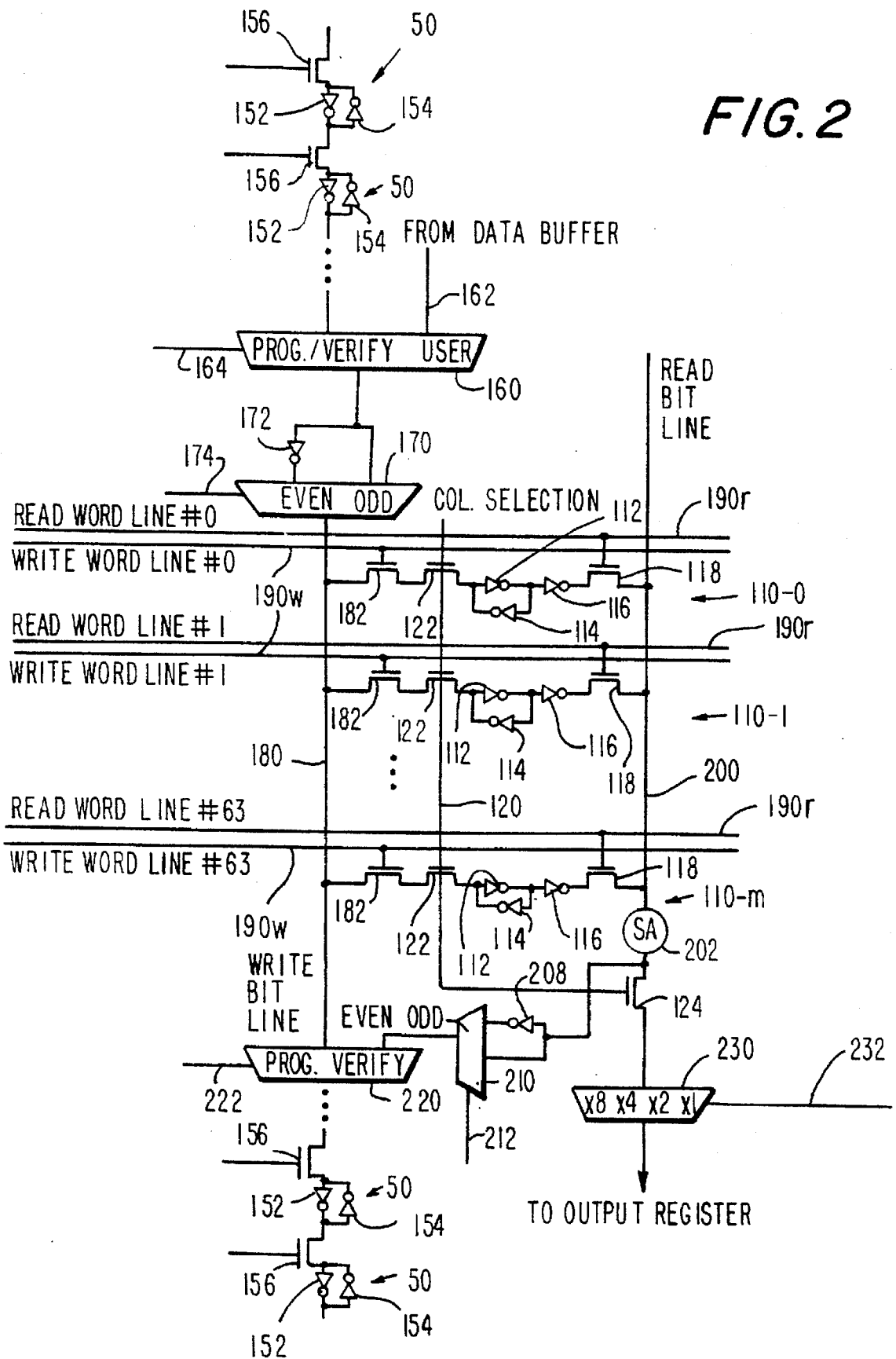
FIG. 2 is a simplified schematic block diagram of an illustrative embodiment of a representative portion of the circuitry of FIG. 1 in accordance with this invention.

The memory cells 50 in each column are connected in a FIFO chain (see FIG. 2, where fragments of one FIFO chain are shown above and below the RAM block circuitry). As shown in FIG. 2 each cell 50 includes a relatively strong inverter 152 directed downwardly, and relatively weak inverter 154 directed upwardly and connected across the associated strong inverter 152. Each weak inverter 154 is strong enough to maintain the logic condition of the associated strong inverter 152 (i.e., logic 0 output or logic 1 output) in the absence of an external input to the strong inverter from above. However, the weak inverter 154 is not strong enough to prevent switching of the strong inverter 152 by an external signal from above. Each cell 50 is selectively connected to the cell (generally 50) above by a transistor 156 between the cells.

A register 60 (FIG. 1) is used during programming and verification to control transistors 156 on a row-by-row basis. Register 60 has one stage (with an output) for each row of memory cells 50. When programming begins, the output signals of register 60 turn on the transistors 156 in all rows. This allows programming data applied in parallel to the tops of all columns of memory cells 50 to flow down through all the cells in each column. (It should be noted that programming data flowing down through the depicted FIFO chains is inverted each time it passes from one row to the next.) If desired, data which thus passes all the way through the FIFO chains can be read out to verify that all chains are properly passing data. Thereafter, during each successive pulse of an address clock signal (applied to counter 40, and also to register 60 or the controls for register 60) one output signal of register 60 changes to the level that turns off the transistors 156 in the associated row. The output signals of register 60 change in this way one after another, working from the bottom of the register to the top. This cuts off the rows of memory cells 50 one after another, working from the bottom of the device to the top. Different programming data is typically applied to the tops of the FIFO chains during each successive address clock interval. Thus each row of memory cells 50 that is cut off stores the data (or the inverse of the data) that was applied to the tops of the FIFO chains during the address clock interval just prior to that row being cut off. All of the rows of the device are programmed when all of the outputs of register 60 have changed to the level that turns off the associated transistors 156.

Verification of the data in memory cells 50 is conceptually somewhat similar to programming, except that in the case of verification the initial outputs of register 60 are those corresponding to the conclusion of programming (i.e., all transistors 156 off). These outputs change one at a time during successive address clock pulses to progressively turn on the associated rows of transistors 156, again working from the bottom of the device to the top. The data in each row of memory cells 50 that is thus re-connected to the rows below it flows down to the bottoms of the columns, where it can be read out for verification. The rows are therefore read out for verification one after another, working from the bottom of the device to the top. When all rows have been verified, register 60 will be turning on all of transistors 156 (as it does at the beginning of programming).

It will be appreciated from the foregoing that verification erases memory cells 50, so that after verification it will be necessary to re-program the device. It should also be understood that verification is entirely optional, and that if it is not desired, the portions of this discussion that relate to verification can be omitted.

FIG. 2 shows in more detail how a representative column of RAM block 20 is connected in a representative column of other memory cells 50 in accordance with this invention. Multiplexer 160 passes either (1) the programming or verifying data signal from the portion of the FIFO chain of memory cells 50 which is above the RAM block column, or (2) a user logic data signal on lead 162. The data on lead 162 typically comes from the other logic 28 (FIG. 1) on the device (although this data should not be confused with the signals on address bus 30 in FIG. 1). Multiplexer 160 is controlled by a mode control signal on lead 164. This mode control signal indicates whether the device is in programming/verification mode or user logic mode. The signal on lead 164 may therefore be the same as the signal on above-described lead 35 in FIG. 1.

The output signal of multiplexer 160 is applied in both true and complement forms to the inputs of multiplexer 170. The complement signal is produced by inverter 172. During programming of the rows of RAM block 20, multiplexer 170 operates to pass either the true or complement signal, depending on whether the RAM block row currently being programmed has an odd or even row number in the "RAM Row" list shown toward the right in FIG. 1. At all other times (including during programming of rows above or below RAM block 20, during verification, and during logic operation) multiplexer 170 passes the applied true signal. Multiplexer 170 is controlled in the appropriate manner by the signal on lead 174. Multiplexer 170 is thus used to invert the programming data intended for even-numbered rows in RAM block 20 so that that data can have the same polarity at the top of the FIFO chains leading to RAM block 20 as the data which is concurrently at the top of the FIFO chains that do not include RAM block 20 columns. This is related to the fact (mentioned above) that each row of memory cells 50 inverts the data applied to it either before passing that data on to the next row or before storing that data. The above-described operation of multiplexer 170 makes the programming of each RAM block 20 row look just like the concurrent programming of other memory cells 50 that are outside RAM block 20 but that are otherwise in the same overall row on the device.

Multiplexer 170 is not required to invert programming data destined for rows below RAM block 20 in this embodiment because RAM block 20 has an even number of rows. This also explains why multiplexer 170 is not required to invert signals from multiplexer 160 during verification of rows above RAM block 20. (The presence of an even number of rows in a verification chain (as in a programming chain) has no net effect on the polarity of the data flowing through for verification.) Multiplexer 170 is also not required to invert the output of multiplexer 160 during user logic operation of the device because then it is desired for RAM block 20 to effectively store and subsequently output exactly the data that is applied to it.

The output signal of multiplexer 170 is applied to write bit line 180. The signal on line 180 is applied in parallel to an input gating transistor 182 in each row of RAM block 120. The transistor 182 in each row is enabled to pass the signal on line 180 when the write word line 190w for that row is selected by row address decoder 36 (FIG. 1). If the column selection conductor 120 for the depicted columns is also then selected, the data from line 180 and the selected transistor 182 passes on into the associated memory cell 110 in RAM block 20. During programming, all of conductors 120 in RAM block 20 are selected. During verification, none of conductors 120 are selected. During use of the device to perform logic, only certain ones of conductors 120 are selected by column address decoder 32 as described above.

Each of memory cells 110 is somewhat like one of memory cells 50. Thus each of memory cells 110 includes a relatively strong forward inverter 112 and a relatively weak backward inverter 114 connected across the terminals of the strong inverter. An output inverter 116 restores data stored by inverters 112 and 114 to the polarity of the original input to the cell. Thus, unlike cells 50, cells 110 ultimately do not invert the data applied to them when they output that data.

The contents of memory cells 110 can be read out by selecting the read word line 190r for the row that includes that memory cell. Again, a read word line 190r is selected by row address decoder 36. Selection of a read word line conductor 190r enables the output gating transistors 118 in the associated row to pass the memory cell 110 data of that row to the read bit line 200 in each column. From a sense amplifier 202 in each line 200 the signal on that line is applied (in true and complement form) to the inputs of multiplexer 210 and to column output gating transistor 124.

If data is being read out of a memory cell 110 during use of the device to perform logic, then the column selection line 120 for the column that includes that memory cell must also be selected in order to enable the transistor 124 in that column to pass the data on the associated read bit line 200 out into the user logic via output mode selection circuit 230 (described below). On the other hand, if the data is being read out of memory cell 110 during verification, then it is not necessary to select the column selection line 120 because the path to multiplexer 210 is not gated by transistor 124.

Multiplexer 210 is controlled by the signal on lead 212. The complement signal applied to multiplexer 210 is produced by inverter 208. The path through multiplexer 210 is used during verification of programming data stored in RAM block 20, and multiplexer 210 is then controlled to restore the polarity of programming data read out of RAM block 20 to the polarity that that data had when it was output by multiplexer 160 during programming of the RAM block. Thus multiplexer 210 passes the complement signal applied to it when the RAM block row being verified has an even numbered row address (see FIG. 1), and it passes the true signal applied to it when the RAM block row being verified has an odd numbered row address. This makes verification of programming data stored in RAM block 20 look exactly like verification of programming data stored in other memory cells 50, even though RAM block memory cells 110 are not ultimately inverting (unlike memory cells 50) and are connected in the circuit in parallel, rather than serially as is the case for memory cells 50. The control signal applied to multiplexer 210 indicates whether the RAM block row currently being verified has an odd or even numbered row address.

The output signal of multiplexer 210 is the "verify" input to multiplexer 220. The other ("program") input to multiplexer 220 is write bit line 180. Multiplexer 220 is controlled by control signal 222 to pass its verify input signal during verification of RAM block 20 and to pass its program input signal at all other times. Thus, during verification of RAM block 20, multiplexer 220 switches the read bit line 200 output of the depicted RAM block column into the associated FIFO chain of memory cells 50. At all other times multiplexer 220 allows the write bit line 180 of the depicted RAM block column to be an intermediate connection in the associated FIFO chain of memory cells 50.

A read bit line 200 signal passed by transistor 124 is applied to output mode selection circuit 230. Circuit 230 routes the read bit line signal to any of several user logic outputs of RAM block 20, consistent with whether one, two, four, or eight bits are to be concurrently output by the RAM block. Circuit 230 is controlled in the appropriate manner by the mode selection control signals applied to that circuit via leads 232. Above-mentioned Cliff et al. application Ser. No. 08/442,795 provides additional information regarding use of these different output modes for RAM block 20. Commonly assigned, concurrently filed U.S. patent application Ser. No. 08/555,109 shows an illustrative embodiment of circuitry for providing RAM block 20 with several corresponding user logic input modes (i.e., for allowing operation of RAM block 20 during use of the device to perform logic to receive one, two, four, or eight data bits concurrently). This last-mentioned patent application is also hereby incorporated by reference herein.

A final aspect of the operation of the device should be noted. During programming or verification of RAM block 20, counter 40 (FIG. 1) is used to generate address information for selecting the rows of RAM block 20 one after another. Unlike the rows of memory cells 50, which need to be addressed sequentially but cumulatively during programming or verification, the rows of RAM block 20 need to be selected no more than one at a time. Thus when addressing of the memory rows by register 60 reaches the bottom of RAM block 20, counter 40 is enabled (by logic circuit 42) to begin counting down (i.e., from m, to m−1, to m−2, etc.) in synchronism with continued operation of register 60. Multiplexers 34 are controlled to apply the output signals of counter 40 to row address decoder 36. Counter 40 therefore selects the rows of RAM block 20 one after another, working from the bottom of the RAM block to the top, for either programming or verification. This use of a counter 40 or other similar circuitry to address the rows of RAM block 20 during programming or verification is described in more detail in above-mentioned application Ser. No. 08/555,283.

From the foregoing it will be seen that the circuitry of this invention facilitates operation of RAM block 20 in several different modes compatible with operation of other memory cells 50 in corresponding or related modes. For example, RAM block 20 columns are connected into the FIFO chains of other memory cells 50 during programming and verification of the device, and RAM block 20 is thus programmed or verified through those FIFO chains by the same kind of data flow that programs or verifies the other memory cells. No special modifications of the programming data destined for, or the verifying data from, RAM block 20 is required. In addition, the circuitry of this invention allows and facilitates use of RAM block 20 as either ROM or RAM during operation of the device to perform logic. Data can then be entered into or read out from RAM block 20 using different paths than are used during programming and verification, and several different modes (e.g., one, two, four, or eight bits) may be used to write data to or read data from the RAM block.

It will be understood that the foregoing is only illustrative of the principles of this invention, and that various modifications can be made by those skilled in the art without departing from the scope and spirit of the invention. For example, the possible dimensions of RAM block 20 mentioned above are only illustrative, and it will be understood that the RAM block can be of any desired size. It will also be understood that words like "row" and "column," "up" and "down," "left" and "right," etc., are used arbitrarily herein, and that they can be interchanged in relation to other embodiments of the invention. In other words, the invention is not limited in any way to any particular orientation of the circuitry on the device.

The invention claimed is:

1. Memory circuitry for inclusion on a programmable logic array integrated circuit device, which includes a plurality of logic signal conductors, comprising:
    a plurality of programmable first memory cells;
    interconnection circuitry for selectively interconnecting said first memory cells in a series such that each of said first memory cells is programmable from a preceding first memory cell in said series when said first memory cell is connected to said preceding first memory cell in said series;
    a second programmable memory cell having an input terminal and an output terminal for selectively storing data applied to said input terminal and for subsequently outputting the data thus stored by said second memory cell; and
    input switching circuitry for selectively connecting said input terminal to said interconnection circuitry at an intermediate point which is between two adjacent ones of said first memory cells in said series and for alternatively connecting said input terminal to a first of said logic signal conductors.

2. The circuitry defined in claim 1 further comprising:
    output switching circuitry for selectively connecting said output terminal to said interconnection circuitry at a medial point which is between two adjacent ones of said first memory cells in said series and for alternatively connecting said output terminal to a second of said logic signal conductors.

3. The circuitry defined in claim 2 wherein said intermediate point and said medial point are between the same two of said first memory cells in said series.

4. The circuitry defined in claim 1 wherein said second memory cell is one of a plurality of similar second memory cells, all of which are connected in parallel between said input terminal and said output terminal.

5. The circuitry defined in claim 4 wherein each of said second memory cells comprises:
    data storage circuitry;
    write gate circuitry for selectively connecting said input terminal to said data storage circuitry in order to apply data from said input terminal to said data storage circuitry for storage therein; and
    read gate circuitry for selectively connecting said data storage circuitry to said output terminal in order to output data stored in said data storage circuitry to said output terminal.

6. The circuitry defined in claim 5 wherein said write gate circuitry in each of said second memory cells comprises:
    a first selection circuit which can be selected separately from the first selection circuit in any others of said second memory cells; and
    a second selection circuit connected in series with said first selection circuit between said input terminal and said data storage circuitry which can only be selected concurrently with the second selection circuits in all of said second memory cells.

7. The circuitry defined in claim 6 wherein the read gate circuitry in each of said second memory cells can be enabled to connect said data storage circuitry to said output terminal separately from the read gate circuitry in any others of said second memory cells.

8. The circuitry defined in claim 7 further comprising:
    output switching circuitry for selectively connecting said output terminal to said interconnection circuitry at a medial point which is between two adjacent ones of said first memory cells in said series and for alternatively connecting said output terminal to a second of said logic signal conductors.

9. The circuitry defined in claim 8 wherein said output switching circuitry comprises:
    a third selection circuit connected in series between said output terminal and said second of said logic signal conductors for selectively connecting said output terminal to said second of said logic signal conductors.

10. The circuitry defined in claim 9 wherein said second and third selection circuits are interconnected so that they are selected concurrently.

11. The circuitry defined in claim 8 wherein said intermediate point and said medial point are between the same two of said first memory cells in said series.

12. The circuitry defined in claim 1 wherein each of said first memory cells inverts data applied to it by the preceding first memory cell in said series.

13. The circuitry defined in claim 12 wherein said input switching circuitry comprises:
    selective inversion circuitry for selectively inverting a signal at said intermediate point for application to said input terminal.

14. The circuitry defined in claim 12 further comprising:
    output switching circuitry for selectively connecting said output terminal to said interconnection circuitry at a medial point which is between two adjacent ones of said first memory cells in said series and for alternatively connecting said output terminal to a second of said logic signal conductors, said output switching circuitry including selective inversion circuitry for selectively inverting a signal at said output terminal for application to said medial point.

15. The circuitry defined in claim 14 wherein said intermediate point and said medial point are between the same two of said first memory cells in said series.

16. The circuitry defined in claim 1 further comprising:
    interconnection control circuitry for selectively controlling said interconnection circuitry to initially interconnect all of said first memory cells in said series and to thereafter sequentially disconnect said first memory cells from one another.

17. The circuitry defined in claim 16 further comprising:
   write gate circuitry responsive to said interconnection control circuitry disconnecting the first memory cells that are adjacent to said intermediate point from one another for thereafter causing said second memory cell to store data applied to said input terminal.

18. The circuitry defined in claim 2 further comprising:
   interconnection control circuitry for selectively controlling said interconnection circuitry to initially disconnect all of said first memory cells in said series and to thereafter sequentially interconnect said first memory cells to one another.

19. The circuitry defined in claim 18 further comprising:
   read gate circuitry responsive to said interconnection control circuitry interconnecting a first memory cell that is adjacent to said medial point to said medial point for thereafter causing said memory cell to output data stored in said second memory cell to said output terminal.

20. The circuitry defined in claim 1 wherein said plurality of programmable first memory cells is one of a multiplicity of similar pluralities of programable first memory cells; wherein said interconnection circuitry is one of a multiplicity of similar interconnection circuitries, each of which selectively interconnects said first memory cells in a respective one of said pluralities in a respective series; wherein said second programmable memory cell is one of a multiplicity of similar second programmable memory cells, each of which is associated with a respective one of said pluralities; and wherein said input switching circuitry is one of a multiplicity of similar input switching circuitries, each of which selectively connects the input terminal of a respective one of said second memory cells to a respective one of said interconnection circuitries at an intermediate point in the respective series and for alternatively connecting said input terminal to a respective one of a first subplurality of said logic signal conductors.

21. The circuitry defined in claim 20 further comprising:
   a multiplicity of output switching circuitries, each of which selectively connects the output terminal of a respective one of said second memory cells to a respective one of said interconnection circuitries at a medial point which is between two adjacent ones of said first memory cells in the respective series and for alternatively connecting said output terminal to a respective one of a second subplurality of said logic signal conductors.

22. The circuitry defined in claim 21 wherein, in each of said series, said intermediate point and said medial point are between the same two of said first memory cells in said series.

23. The circuitry defined in claim 20 wherein the second memory cell associated with each of said pluralities is one of a multiple of similar second memory cells associated with that plurality, all of the second memory cells in each of said multiples of second memory cells being connected in parallel with one another between the associated input and output terminals.

24. The circuitry defined in claim 23 wherein each of said second memory cells comprises:
   data storage circuitry;
   write gate circuitry for selectively connecting the input terminal associated with that second memory cell to said data storage circuitry in order to apply data from said input terminal to said data storage circuitry for storage therein; and
   read gate circuitry for selectively connecting said data storage circuitry to the output terminal associated with that second memory cell in order to output data stored in said data storage circuitry to said output terminal.

25. The circuitry defined in claim 24 wherein said write gate circuitry in each of said second memory cells comprises:
   a first selection circuit which can be selected separately from the first selection circuit in any others of said second memory cells in the multiple of second memory cells that includes that second memory cell; and
   a second selection circuit connected in series with said first selection circuit between the input terminal associated with that second memory cell and the data storage circuit of that second memory cell, all of said second selection circuits in each of said multiples of second memory cells being interconnected for concurrent selection.

26. The circuitry defined in claim 25 wherein each of said first selection circuits in one of said multiples of said second memory cells is interconnected to a respective one of the first selection circuits in each of the other multiples of said second memory cells for concurrent selection of all of the first selection circuits that are thus interconnected.

27. The circuitry defined in claim 26 wherein each of the read gate circuitries in one of said multiples of said second memory cells is interconnected to a respective one of the read gate circuitries in each of the other multiples of said second memory cells for concurrent enablement of all of the read gate circuitries that are thus interconnected, each of the thus concurrently enableable groups of said read gate circuitries being separately selectable for enablement.

28. The method of programming memory on a programmable logic array integrated circuit device which includes a plurality of first memory cells that are selectively interconnectable in a series in which each of said first memory cells is programmable from a preceding first memory cell in said series, and a second memory cell that is selectively connectable to an intermediate point which is between two adjacent ones of said first memory cells in said series, said programmable logic array integrated circuit further including a plurality of logic signal conductors, said method comprising the steps of:
   applying successive programming data bits to a beginning of said series during respective successive programming time intervals;
   disconnecting a respective one of said first memory cells from said series after each of respective programming time intervals, said first memory cells being thus disconnected from said series in order progressing from an end of said series which is remote from said beginning;
   connecting said second memory cell to said intermediate point when all of said first memory cells beyond said intermediate point have been disconnected in order to program said second memory cell with programming data from said intermediate point;
   disconnecting said second memory cell from said intermediate point after programming of said second memory cell in said connecting step; and
   selectively connecting said second memory cell to a first one of said logic signal conductors in order to read out from said second memory cell data stored in said second memory cell.

29. The method defined in claim 28 wherein said second memory cell is one of a plurality of similar second memory cells, each of which is selectively connectable to said intermediate point, and wherein said connecting step comprises the step of:

selecting said second memory cells one after another for connection to said intermediate point during respective successive programming time intervals when all of said first memory cells beyond said intermediate point have been disconnected in order to program said second memory cells with programming data from said intermediate point.

30. The method defined in claim 29 wherein said selectively connecting step comprises the step of:

selecting any one of said second memory cells for connection to said first one of said logic signal conductors in order to read out from the selected one of said second memory cells the data stored in that one of said second memory cells.

31. The method defined in claim 28 further comprising the step of:

selectively applying data to said second memory cell from a second one of said logic signal conductors.

32. The method defined in claim 31 wherein said selectively applying step is performable after all of said first memory cells have been disconnected from one another in accordance with said disconnecting step.

33. The method defined in claim 29 wherein each of said first memory cells inverts data it receives, and wherein said method further comprises the step of:

selectively inverting data applied to said intermediate point.

34. The method defined in claim 28 further comprising the steps of:

after all of said first memory cells have been disconnected from one another in accordance with said disconnecting step, re-connecting a respective one of said first memory cells to said series during each of respective verification time intervals, said first memory cells being thus re-connected to said series in order progressing from an end of said series which is remote from said beginning in order to read out for verification via the re-connected first memory cells data stored in said first memory cells; and connecting said second memory cell to a medial point which is between two adjacent ones of said first memory cells in said series when all of said first memory cells beyond said medial point have been re-connected in order to read out from said second memory cell via the re-connected first memory cells data stored in said second memory cell for verification of said data stored in said second memory cell.

35. The method defined in claim 34 wherein said second memory cell is one of a plurality of similar second memory cells, each of which is selectively connectable to said intermediate point, and wherein said step of connecting said second memory cell to said medial point comprises the step of:

selecting said second memory cells one after another for connection to said medial point during respective successive verification time intervals when all of said first memory cells beyond said medial point have been re-connected in order to read out from said second memory cells via the reconnected first memory cells data stored in said second memory cells for verification of said data stored in said second memory cells.

36. The method defined in claim 35 wherein said selectively connecting step comprises the step of:

selecting any one of said second memory cells for connection to said first one of said logic signal conductors in order to read out from the selected one of said second memory cells the data stored in that one of said second memory cells.

37. The method defined in claim 35 wherein each of said first memory cells inverts data it receives, and wherein said method further comprises the step of:

selectively inverting data applied to said medial point from said second memory cells.

\* \* \* \* \*